United States Patent [19]

Necoechea

[11] 3,913,024

[45] Oct. 14, 1975

[54] CONDENSER MICROPHONE PREAMPLIFIER

[75] Inventor: R. Warren Necoechea, Tustin, Calif.

[73] Assignee: Altec Corporation, Anaheim, Calif.

[22] Filed: Aug. 14, 1974

[21] Appl. No.: 497,230

[52] U.S. Cl. .................. 330/29; 179/1 A; 179/1 F; 330/22; 330/28; 330/35; 330/137

[51] Int. Cl.² .................. H03G 3/30

[58] Field of Search ............. 330/22, 28, 29, 35, 40, 330/107, 110, 137; 179/1 A, 1 D, 1 F, 1 SW, 1 VL

[56] References Cited

UNITED STATES PATENTS

| | | | |
|---|---|---|---|
| 2,959,741 | 11/1960 | Murray | 330/19 |
| 3,300,585 | 1/1967 | Reedyk et al. | 330/35 UX |
| 3,422,225 | 1/1969 | Griese | 179/1 A |
| 3,713,031 | 1/1973 | Williams et al. | 330/35 X |

FOREIGN PATENTS OR APPLICATIONS

| | | | |
|---|---|---|---|
| 1,104,122 | 8/1965 | United Kingdom | 179/1 A |
| 1,562,209 | 3/1968 | Germany | 179/1 A |

OTHER PUBLICATIONS

Burrows, "Ceramic Pickups and Transistor Pre-Amplifiers," *Wireless World*, Feb. 1970, pp. 56–60, 80.

*Primary Examiner*—James B. Mullins
*Attorney, Agent, or Firm*—Edward A. Sokolski

[57] ABSTRACT

A selected amount of negative feedback is provided directly to a condenser microphone from the amplified output thereof. This end result is achieved by feeding a negative feedback signal from the output of the microphone amplifier to one terminal of each of the capacitors in a capacitor bank. A selector switch is then utilized to select one of the capacitors, each of which has a different capacitance, to carry the feedback signal directly to the condenser transducer element of the microphone. In this manner, the amount of negative feedback to the microphone can be selectively controlled, thereby effectively controlling the amplitude of the output signal and thus the effective gain imparted to the output of the microphone by the amplifier.

6 Claims, 2 Drawing Figures

CONDENSER MICROPHONE PREAMPLIFIER

This invention relates to electronic amplifiers and more particularly, to such an amplifier for use with a condenser microphone in controlling the amplification of the output thereof.

A preamplifier circuit is generally provided for a condenser microphone to provide amplification of the output thereof right at the microphone transducer to develop a suitable signal for transmission over a microphone cable to the main amplifier unit. It is necessary to adjust the gain of this preamplifier to provide a proper input signal to meet the particular application requirements at hand. In microphone amplifiers of the prior art, such gain control has been implemented in two general ways:

A first prior art approach is the use of a resistive pad in the output circuit of the preamplifier which is adjusted to tap off any desired percentage of the full output of the amplifier. With this approach it is necessary that the amplifier be run at its maximum gain at all times, regardless of the amount of output signal required. This has the disadvantage of resulting in operation of the amplifier in non-linear regions where distortion is likely to occur. Even where the amplifier may be initially designed for linear operation with such full gain operation, distortion is likely to appear with the aging of components, changes in operating voltages, etc. Thus, the utilization of a gain control which tops off a signal in the output circuitry, unless the amplifier is to be limited in its gain capabilities well below its full capacity, has distinct disadvantages.

Another approach of prior art systems is the use of a bank of shunt capacitors which are used in conjunction with a selector switch to place any one of said capacitors in parallel with the microphone transducer element, thereby shunting a portion of the output thereof in accordance with the capacitance of the particular capacitor used. While this solves the problem mentioned above by providing a lower signal for the amplifier to handle at lower gain levels, thus minimizing distortion, it results in a poorer signal/noise ratio to the amplifier with high attenutaion (low gain settings) than with low attenuation (high gain settings). This is because the noise level of the output signal of the microphone transducer does not decrease in proportion to the attenuation of this signal provided by the various shunt capacitors. Therefore, this second approach also has distinct disadvantages.

It is to be noted that the use of a simple gain control potentiometer in the amplifier input circuits is not generally found in microphone preamplifiers because of the deterioration of signal/noise ratio which it engenders.

The present invention overcomes the aforementioned shortcomings of the prior art in a simple yet highly effective manner by utilizing a technique for selectively adjusting negative feedback directly to the condenser microphone transducer output (first amplifier stage input) to control the effective gain of the amplifier output signals. With this approach, the signal level handled by all stages of the amplifier is in accordance with the gain setting, such that the amplifier is permitted to operate below its full gain capacity in linear regions of operation except at the occasional times when there is a maximum gain setting. Further, the signal to noise ratio remains the same regardless of the gain setting and does not deteriorate with low gain settings, as with the shunt capacitance gain control mentioned above.

Referring to the Figures.

Figures 1, 2:
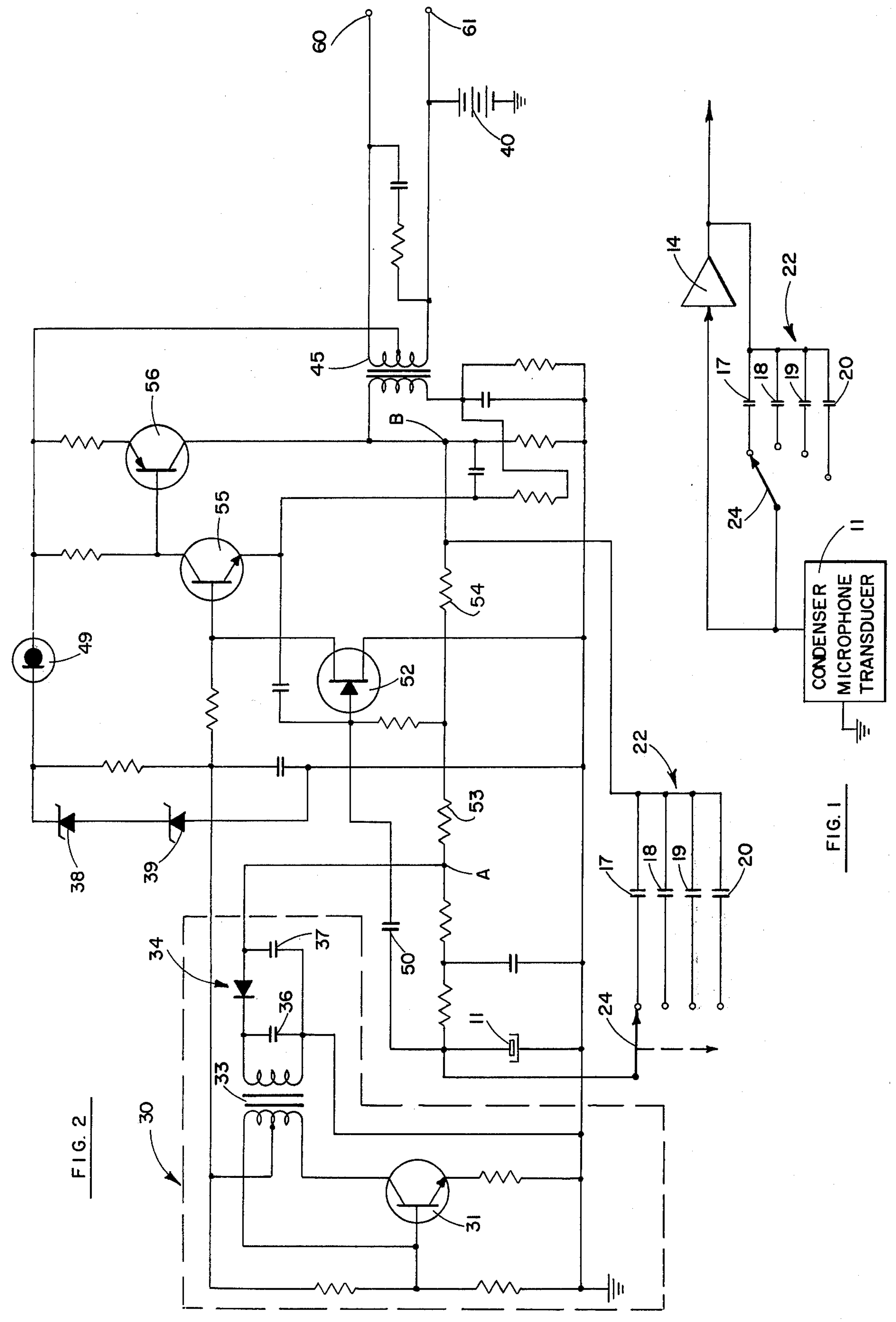
FIG. 1 is a functional schematic diagram illustrating the invention.
FIG. 2 is a schematic drawing illustrating one embodiment of the invention.

Briefly described, the invention is as follows:

Negative feedback is provided directly to a condenser microphone transducer output through a capacitor which feeds the amplified output of the microphone transducer in an inverted form from the amplifier to the microphone transducer. The capacitor is part of a bank of capacitors, there being a selector switch to select any one of the capacitors in the bank to carry the feedback signal. The amount of feedback provided, and thus the effective gain in the amplifier is a function of the capacitance of the particular capacitor selected. Thus, the selector switch can be operated to vary the effective amplifier gain.

Referring now to FIG. 1, the circuit of the invention is schematically illustrated. The output of condenser microphone transducer 11 is fed to inverting amplifier 14, the output of the amplifier having a 180° phase relationship with the output of the microphone. A negative feedback signal is fed from the output of amplifier 14 directly to condenser microphone transducer 11 through one of the capacitors 17–20 of capacitor bank 22. Any one of capacitors 17–20 may be selected by means of selector switch 24 to carry the feedback signal to the microphone. Feedback capacitors 17–20 are chosen to provide a range of attenuations for the feedback signal so as to provide the desired gain range for the amplifier. A typical set of values for capacitors 17–20 are 3.3, 10, 33, and 330 picofarads respectively.

Referring now to FIG. 2, a preferred embodiment of the invention is schematically illustrated. A stable source of negative voltage for use as a bias and polarizing voltage is provided by means of oscillator and rectifier circuit 30. This circuit includes transistor 31 which operates as an oscillator at a frequency which may be of the order of 300 kiloHertz. The output of the oscillator is fed through transformer 33 to rectifier 34 which converts the signal to a DC having a negative polarity with respect to ground. Capacitors 36 and 37 provide filtering for the rectified signal. A stable source of DC is provided for the oscillator by means of Zener diodes 38 and 39 which receive power from DC power source 40 through the secondary winding of transformer 45 and constant current diode 49. Thus, a negative voltage is provided at point A, which may be of the order of −63 volts with a power supply 40 providing a voltage of the order of 12 volts.

The output of condenser microphone transducer 11 is fed through capacitor 50 to the control gate of FET 52 which is connected in common source configuration. The FET operates as an inverting amplifier, its output being fed to cascaded transistor amplifier stages 55 and 56, the output of amplifier 56 (point B) being substantially in phase with the output of FET 52. The output of amplifier 56 is fed through transformer 45 to output terminals 60 and 61. A negative feedback signal is fed from point B to one terminal of each of capacitors 17–20. Any one of the capacitors may be selected by means of switch 24 to carry the feedback signal to condenser microphone transducer 11. As already noted, the amount of negative feedback and thus the effective gain of the amplifier is governed in accordance with the capacitive reactance of the particular capacitor selected by means of the switch.

It is to be noted that by proper choice of divider and biasing resistors, it is possible to hold the bias voltage at the gate of FET 52 constant at a point for optimum operation. It is to be noted along these lines that this end result is achieved by virtue of the fact that there is a negative voltage maintained with respect to ground at point A, and a positive voltage at point B with resistors 53 and 54 forming a divider therebetween.

While the invention has been described and illustrated in detail, it is to be clearly understood that this is intended by way of illustration and example only and is not to be taken by way of limitation, the spirit and scope of this invention being limited only by the terms of the following claims.

I claim:

1. In an amplifier for a condenser microphone transducer, means for controlling the gain of said amplifier comprising:

means for providing a plurality of different capacitances, means for selecting one of said capacitances, means for coupling the output of said transducer to the amplifier, and means for providing a negative feedback signal from said amplifier directly to said transducer through the selected capacitance.

2. The amplifier of claim 1 wherein said means for providing a plurality of different capacitances comprises a bank of capacitors, each of the capacitors of said bank having a different capacitance.

3. The amplifier of claim 2 wherein said means for selecting one of said capacitances and for providing a feedback signal comprises a selector switch having a selector arm connected to a first switch terminal, said selector switch having a separate switch contact respectively connected to one terminal of each of said capacitors, the other terminal of said capacitors being commonly connected to a second switch terminal, one of said switch terminals being connected to the output of the amplifier, the other of said switch terminals being connected to the output of said microphone transducer.

4. The amplifier of claim 2 further including means for providing a negative bias voltage for said amplifier, said last mentioned means comprising an oscillator, means for providing a positive DC voltage, said positive voltage being used for operating said oscillator and a rectifier for converting the output of said oscillator to a negative DC voltage.

5. The amplifier of claim 4 wherein is included an FET coupled to receive the output of said microphone to provide an inverting amplification thereof, a first transistor for amplifying the output of said FET, a second transistor for amplifying the output of said first transistor, the output of said second transistor being fed to said bank of capacitors, and a voltage divider having said negative bias voltage and said positive voltage fed to the opposite ends thereof, said divider having a tap point for providing a substantially constant predetermined bias voltage to said FET.

6. In combination, a condenser microphone transducer, an amplifier for amplifying the output of said microphone, and means for varying the gain of said amplifier by selectively varying the negative feedback of said amplifier, said last mentioned means including a bank of capacitors having different capacitances, one terminal of each of the capacitors being connected to the output of said amplifier, and a selector switch for alternatively connecting any one of the other terminals of said capacitor to an output terminal of said microphone transducer.

* * * * *